United States Patent
Streppel (10) Patent No.: US 12,360,419 B2
(45) Date of Patent: Jul. 15, 2025

(54) BACKLIGHTING UNIT WITH A REFLECTOR, A DIFFUSER, AND AN OPTICAL ASSEMBLY

(71) Applicant: ams-OSRAM International GmbH, Regensburg (DE)

(72) Inventor: Ulrich Streppel, Regensburg (DE)

(73) Assignee: ams-OSRAM International GmbH, Regensburg (DE)

( * ) Notice: Subject to any disclaimer, the term of this patent is extended or adjusted under 35 U.S.C. 154(b) by 0 days.

(21) Appl. No.: 18/563,693

(22) PCT Filed: May 24, 2022

(86) PCT No.: PCT/EP2022/064033
§ 371 (c)(1),
(2) Date: Nov. 22, 2023

(87) PCT Pub. No.: WO2022/248461
PCT Pub. Date: Dec. 1, 2022

(65) Prior Publication Data
US 2024/0280857 A1 Aug. 22, 2024

(30) Foreign Application Priority Data
May 26, 2021 (DE) .......................... 102021113573.7

(51) Int. Cl.
*G02F 1/1335* (2006.01)
*G02F 1/13357* (2006.01)

(52) U.S. Cl.
CPC .. *G02F 1/133607* (2021.01); *G02F 1/133603* (2013.01); *G02F 1/133605* (2013.01); *G02F 1/133608* (2013.01)

(58) Field of Classification Search
CPC ......... G02F 1/133607; G02F 1/133603; G02F 1/133605; G02F 1/133608
See application file for complete search history.

(56) References Cited

U.S. PATENT DOCUMENTS

2002/0085287 A1 7/2002 Egawa
2007/0064423 A1 3/2007 Shimura
(Continued)

FOREIGN PATENT DOCUMENTS

| CN | 110703497 A | 1/2020 |
| CN | 107430220 B | 3/2021 |
| EP | 3447807 A1 | 2/2019 |

OTHER PUBLICATIONS

International Search Report for International Patent Application No. PCT/EP2022/064033, mailed Sep. 14, 2022 (5 pages).

*Primary Examiner* — Tracie Y Green
(74) *Attorney, Agent, or Firm* — ArentFox Schiff LLP (57) ABSTRACT

A backlighting unit comprises a carrier having a top side arranged parallel to an x-y-plane, a reflector assemblage arranged over the carrier in a z-direction, an optical assemblage arranged over the reflector assemblage in the z-direction, and a diffuser arranged over the optical assemblage in the z-direction. A cell of the backlighting unit comprises a section of the carrier having an optoelectronic semiconductor chip arranged on the top side, a reflector of the reflector assemblage, an optical element of the optical assemblage, and a section of the diffuser. The reflector has a concave mirror surface. The optical element has a front side facing the reflector and a rear side facing away from the reflector. The front side is subdivided into front-side surface sections arranged in a matrix-type fashion. The rear side is subdivided into rear-side surface sections arranged in a matrix-type fashion.

19 Claims, 5 Drawing Sheets

(56) References Cited

U.S. PATENT DOCUMENTS

| | | |
|---|---|---|
| 2011/0267560 A1 | 11/2011 | Usukura |
| 2018/0059482 A1 | 3/2018 | Li et al. |
| 2019/0049651 A1* | 2/2019 | Yamamoto ............ G02B 6/0035 |
| 2019/0285246 A1* | 9/2019 | Yamamoto .......... G02B 27/0977 |
| 2019/0369392 A1* | 12/2019 | Matsuura ............. G02B 3/0068 |
| 2020/0012259 A1 | 1/2020 | Uenishi |

* cited by examiner

BACKLIGHTING UNIT WITH A REFLECTOR, A DIFFUSER, AND AN OPTICAL ASSEMBLY

The present invention relates to a backlighting unit.

This patent application is a 35 U.S.C. § 371 National Phase of PCT Application No. PCT/EP2022/064033, filed on May 24, 2022, which claims the priority of German Patent Application No. 10 2021 113 573.7, filed on May 26, 2021, the disclosures of which are hereby incorporated by reference in their entireties.

Backlighting units are used, for example, for backlighting display screens. Numerous known backlighting units have a high thickness in order to enable an adequate light distribution and thus achieve a uniform illumination. Flatter backlighting systems are enabled in the prior art by using side-emitting light-emitting diodes, which requires complicated structural forms.

One object of the present invention is to provide a backlighting unit. This object is achieved by a backlighting unit having the features of the independent claim. Various refinements are specified in the dependent claims.

A backlighting unit comprises a carrier having an upper side arranged parallel to an x-y plane, a reflector assembly arranged in a z direction above the carrier, an optical assembly arranged in the z direction above the reflector assembly, and a diffuser arranged in the z direction above the optical assembly. A cell of the backlighting unit comprises a section of the carrier having an optoelectronic semiconductor chip arranged on the upper side, a reflector of the reflector assembly, an optical element of the optical assembly, and a section of the diffuser. The reflector has a concave mirror surface. The optical element has a front side facing toward the reflector and a rear side facing away from the reflector. The front side is divided into front-side surface sections arranged in the form of a matrix. The rear side is divided into rear-side surface sections arranged in the form of a matrix. At least two front-side surface sections are designed differently. At least two rear-side surface sections are also designed differently. Each front-side surface section and each rear-side surface section is designed so that a light beam penetrating the respective surface section centrally in the z direction experiences a defined beam deflection and a defined beam expansion.

This backlighting unit can advantageously be made very flat, for example, having a thickness of less than 3 mm. The backlighting unit can be suitable, for example, for direct backlighting of a display screen. One particular advantage of the backlighting unit is that it permits a use of conventional and inexpensive surface-emitting light-emitting diode chips. The backlighting unit advantageously has a low sensitivity with respect to positioning tolerances and with respect to variations of the index of refraction of the material of the optical assembly.

In one embodiment of the backlighting unit, an air gap is formed between the reflector assembly and the optical assembly. This air gap advantageously offers space for homogenization of the light running from the reflector assembly to the optical assembly.

In one embodiment of the backlighting unit, an air gap is formed between the optical assembly and the diffuser. Advantageously, an adequate index of refraction difference is ensured by this air gap at the interface between the optical assembly and air gap. In addition, the air gap offers space for a homogenization of the light passing from the optical assembly to the diffuser.

In one embodiment of the backlighting unit, the reflector has a rectangular upper opening on an upper side facing toward the optical element. Edges of the optoelectronic semiconductor chip are oriented parallel to edges of the upper opening in this case. Such a design of the upper opening of the reflector and such an alignment of the optoelectronic semiconductor chip have advantageously proven to be particularly effective in order to achieve uniform backlighting.

In one embodiment of the backlighting unit, the reflector has a lower opening in the form of a circular disk on a lower side facing toward the carrier. It has proven to be particularly favorable to form the lower opening of the reflector having a different shape than the upper opening of the reflector.

In one embodiment of the backlighting unit, the mirror surface of the reflector is divided into four azimuthal sectors. The mirror surface has folds at boundaries between the sectors in this case. A reflector having such a mirror surface may advantageously be produced easily and reliably. A mirror surface designed in this way has proven to be particularly effective in order to uniformly distribute the light emitted by the optoelectronic semiconductor chip.

In one embodiment of the backlighting unit, each sector has a planar inner facet and a planar outer facet. The inner facet and the outer facet are arranged at an angle in relation to one another here. A reflector having a mirror surface designed in this way may advantageously be produced easily and reliably. The design of the mirror surface has proven to be effective in this case to achieve a uniform distribution of the light emitted by the optoelectronic semiconductor chip.

In one embodiment of the backlighting unit, the defined beam deflection differs in at least two surface sections. Alternatively or additionally, the defined beam expansion differs in at least two surface sections. It is advantageously thus made possible to design the optical element of the cell of the backlighting unit so that the light emitted by the optoelectronic semiconductor chip is distributed uniformly over the entire surface of the cell.

In one embodiment of the backlighting unit, the beam expansion takes place in at least one surface section according to a top hat scattering distribution having defined scattering width. A desired light distribution by the optical element of the cell of the backlighting unit may advantageously thus be achieved.

In one embodiment of the backlighting unit, at least two front-side surface sections have different sizes. Alternatively or additionally, at least two rear-side surface sections have different sizes. In this case, for example, rear-side surface sections located farther outward can have a smaller size than rear-side surface sections located farther inward. It is advantageously thus possible for essentially the same light components to radiate through a front-side surface section and a respective corresponding rear-side surface section.

In one embodiment of the backlighting unit, the number of the front-side surface sections corresponds to the number of the rear-side surface sections. A simple design of the optical element of the cell of the backlighting unit thus advantageously results.

In one embodiment of the backlighting unit, the front-side surface sections are not congruent with the rear-side surface sections. It is advantageously thus also possible for essentially the same light components to radiate through a front-side surface section and a corresponding rear-side surface section.

In one embodiment of the backlighting unit, the front side of the optical element and/or the rear side of the optical element are mirror symmetrical with respect to a plane of symmetry parallel to an x-z plane and mirror symmetrical with respect to a plane of symmetry parallel to a y-z plane. A simple design of the optical element of the cell of the backlighting unit thus advantageously results.

In one embodiment of the backlighting unit, a surface of at least one surface section is divided into a plurality of surface parts. The surface parts are each tilted in relation to the z direction here. A defined beam deflection by the surface section is thus advantageously achieved. By dividing (facetting) the surface of the surface section into a plurality of surface parts, it is possible for the tilted surface parts to have only a minor height in the z direction.

In one embodiment of the backlighting unit, the surface parts each have a shape deviating from a planar surface, in particular a wave shape, an arrangement of microlenses, an arrangement of prisms, or a randomized roughening. A defined beam expansion by this surface section of the optical element is thus advantageously achieved.

In one embodiment of the backlighting unit, the diffuser is designed as a plane-parallel plate and has embedded scattering particles. Such a diffuser is advantageously producible easily and inexpensively and has a suitable scattering characteristic.

In one embodiment of the backlighting unit, the diffuser is designed as a microoptically structured surface diffuser. Such a diffuser advantageously also has a suitable scattering characteristic.

In one embodiment of the backlighting unit, the diffuser scatters light upon irradiation using a collimated light source so that the relative intensity decreases in a first scattering angle range from 0° to 90° and increases in a second scattering angle range from 90° to 180°. The relative intensity is greater here at a scattering angle of 0° than at a scattering angle of 180°. The diffuser then advantageously also causes, in addition to a forward scattering, a reverse scattering, by which an additional homogenization of the light emitted by the backlighting unit is achieved.

In one embodiment of the backlighting unit, a wavelength-converting element is arranged between the optical assembly and the diffuser. The wavelength-converting element can be provided to convert electromagnetic radiation emitted by the optoelectronic semiconductor chip into electromagnetic radiation of a different wavelength. This can enable, for example, a use of an optoelectronic semiconductor chip which emits blue light.

In one embodiment of the backlighting unit, it has multiple identical cells. The cells are arranged in the form of a matrix here. The backlighting unit can thus advantageously be designed having large dimensions and enable a uniform backlighting of a large surface.

The above-described properties, features, and advantages of this invention and the manner in which they are achieved will become clearer and more comprehensible in conjunction with the following description of the exemplary embodiments, which are explained in more detail in conjunction with the drawings. In the schematic figures.

Figure 1:
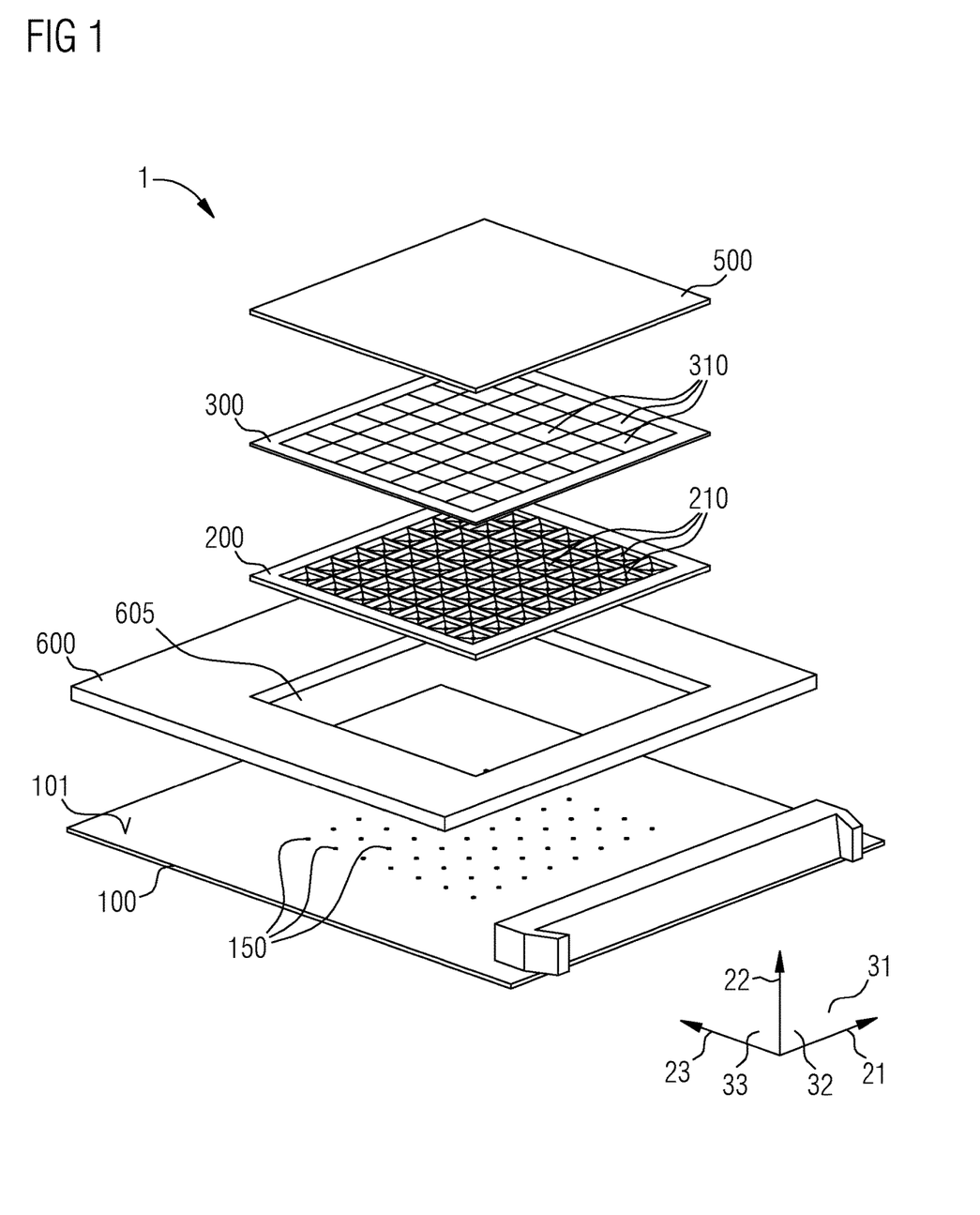
FIG. 1 shows an exploded illustration of a backlighting unit.

FIG. 1 shows an exploded illustration of a backlighting unit 1 in a schematic view. The backlighting unit 1 can be provided to backlight a display screen or another display device, for example, a liquid crystal display screen.

The backlighting unit 1 comprises a carrier 100. The carrier 100 can be designed, for example, as a circuit board, for example, as a printed circuit board (PCB).

An essentially flat upper side 101 of the carrier 100 is oriented parallel to an x-y plane 31 spanned by an x direction 21 and a y direction 22. A z direction 23 is oriented perpendicular to the upper side 101 of the carrier 100.

A plurality of optoelectronic semiconductor chips 150 is arranged in a matrix arrangement on the upper side 101 of the carrier 100. The optoelectronic semiconductor chips 150 are designed to emit electromagnetic radiation, for visible example, light. The optoelectronic semiconductor chips 150 can be designed, for example, as light-emitting diode chips (LED chips).

A reflector assembly 200 is arranged above the carrier 100 in the z direction 23. The reflector assembly 200 comprises a plurality of reflectors 210 arranged in the form of a matrix.

An optical assembly 300 is arranged above the reflector assembly 200 in the z direction 23. The optical assembly 300 comprises a plurality of optical elements 310 arranged in the form of a matrix.

A diffuser 500 is arranged above the optical assembly 300 in the z direction 23.

In the example shown in FIG. 1, the reflector assembly 200, the optical assembly 300, and the diffuser 500 are mounted in a recess 605 of a holding frame 600 arranged in the z direction 23 above the upper side 101 of the carrier 100. However, this is solely by way of example. The components of the backlighting unit 1 can also be aligned in relation to one another and fastened on one another in another manner.

Figure 2:
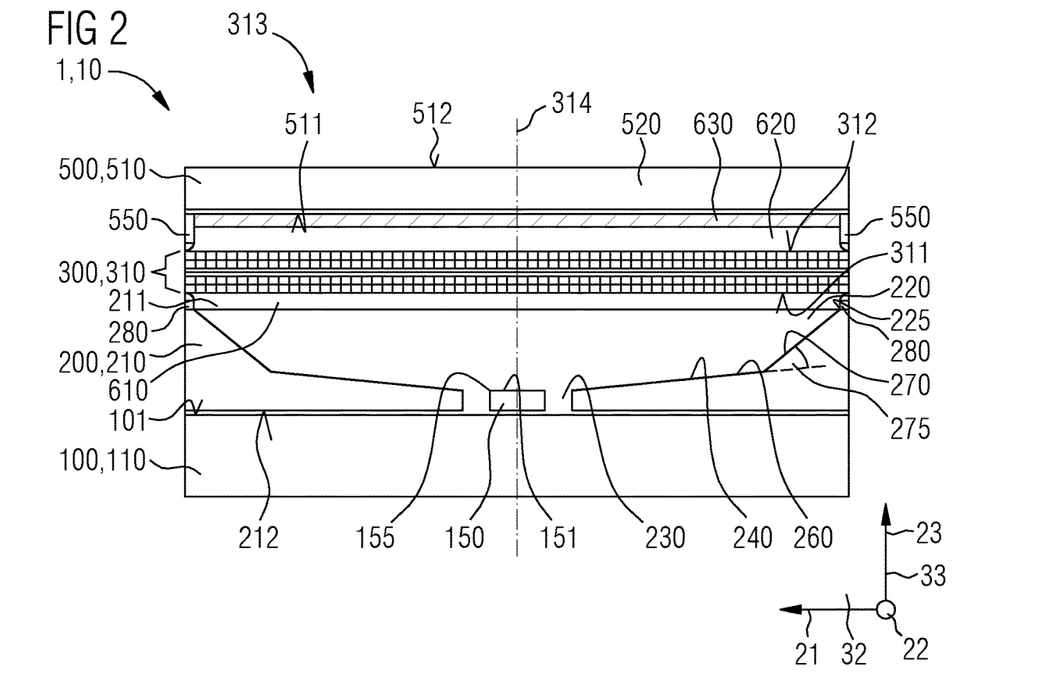
FIG. 2 shows a sectional side view of a cell of the backlighting unit.

The number of the optoelectronic semiconductor chips 150 arranged in the form of a matrix on the upper side 101 of the carrier 100 corresponds to the number of the reflectors 210 of the reflector assembly 200 and the number of the optical elements 310 of the optical assembly 300, so that in each case an optoelectronic semiconductor chip 150, a reflector 210 of the reflector assembly 200, and an optical element 310 of the optical assembly 300 are associated with one another. The schematic sectional side view of FIG. 2 shows that in each case a section 110 of the carrier 100 forms a cell 10 of the backlighting unit 1 with an optoelectronic semiconductor chip 150 arranged on the upper side 101, a reflector 210 of the reflector assembly 200, an optical element 310 of the optical assembly 300, and a section 510 of the diffuser 500. The backlighting unit 1 therefore comprises a plurality of cells 10 arranged in the form of a matrix. The number of the cells 10 corresponds to the number of the optoelectronic semiconductor chips 150, the number of the reflectors 210 of the reflector assembly 200, and the number of the optical elements 310 of the optical assembly 300.

It is expedient if all cells 10 of the backlighting unit 1 are designed identically. However, it is also possible to design different cells 10 of the backlighting unit 1 differently. For example, different cells 10 can have different sizes.

FIG. 2 shows one of the cells 10 of the backlighting unit 1. An illustration in section at a first plane of symmetry 313 is shown. The first plane of symmetry 313 is parallel to an x-z plane 32 spanned by the x direction 21 and the z direction 23.

It is expedient, but not required, for the cell 10 to be made mirror symmetrical with respect to the first plane of symmetry 313. In addition, the cell 10 can be made mirror symmetrical with respect to a second plane of symmetry 314, which is oriented parallel to a y-z plane 33 spanned by the y direction 22 and the z direction 23. However, this symmetry is also not absolutely required.

FIG. 2 shows the components of the cell 10 of the backlighting unit 1 in the final arrangement thereof. A lower side 212 of the reflector 210 of the cell 10 is arranged directly on the upper side 101 of the section 110 of the carrier 100. A first air gap 610 is formed between an upper side 211 of the reflector 210 facing toward the optical element 310 and a front side 311 of the optical element 310 facing toward the reflector 210. The first air gap 610 can be maintained, for example, by spacers 280 arranged on the upper side 211 of the reflector 210. The first air gap 610 could also be filled with a medium other than air or could be omitted.

A second air gap 620 is formed between a rear side 312 of the optical element 310 facing toward the section 510 of the diffuser 500 and a front side 511 of the section 510 of the diffuser 500 facing toward the optical element 310, which air gap is maintained in the illustrated example by spacers 550 formed on the diffuser 500. The second air gap 620 can also be filled with a medium other than air or can be completely omitted.

In the illustrated example, a wavelength-converting element 630 is additionally arranged in the second air gap 620 between the optical element 310 and the diffuser 500. The wavelength-converting element 630 is designed to convert electromagnetic radiation emitted by the optoelectronic semiconductor chip 150 of the cell 10 at least partially into electromagnetic radiation of a different wavelength. The wavelength-converting element 630 can also be omitted, however.

Still further components, which are not shown in FIGS. 1 and 2, can be arranged in the z direction 23 above a rear side 512 of the section 510 of the diffuser 500 facing away from the optical element 310. For example, a layer stack optimizing the brightness of the backlighting unit 1 by light recycling can be arranged there.

The cell 10 of the backlighting unit 1 shown in FIG. 2 can have edge lengths of 8 mm in each case in the x direction 21 and in the y direction 22, for example. The edge lengths in the x direction 21 and in the y direction 22 can be equal or different. The carrier 100 can have a thickness of 1 mm in the z direction 23, for example. The reflector 210 of the reflector assembly 200 can have a height of 1.27 mm in the z direction 23, for example. The first air gap 610 can have a thickness of 0.2 mm in the z direction 23, for example. The optical element 310 of the optical assembly 300 can have a thickness of 0.5 mm in the z direction 23, for example. The second air gap 620 can have a thickness of 0.46 mm in the z direction 23, for example. The diffuser 500 can have a thickness of 0.56 mm in the z direction 23, for example.

Figure 3:
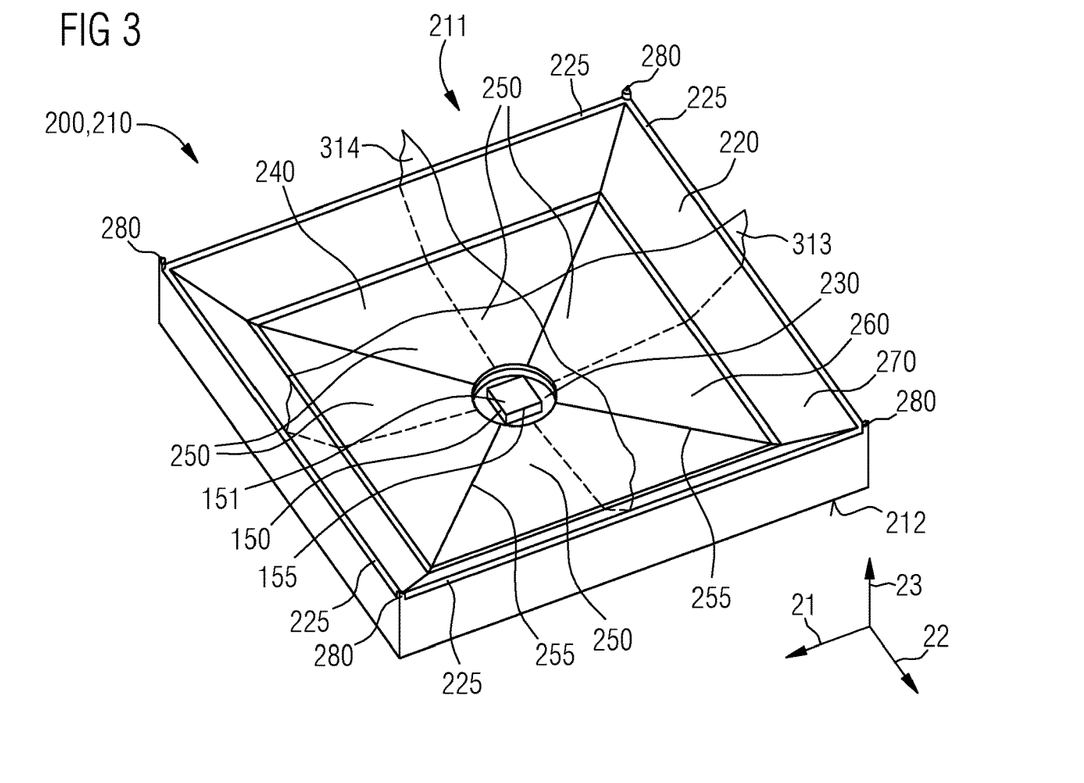
FIG. 3 shows a perspective illustration of a reflector of the cell of the backlighting unit.

FIG. 3 shows a schematic perspective illustration of the reflector 210 and the optoelectronic semiconductor chip 150 of the cell 10 of the backlighting unit 1 shown in FIG. 2 without the other components of the cell 10. The reflector 210 has a concave mirror surface 240 oriented toward the upper side 211 of the reflector 210. At the upper side 211, the mirror surface 240 forms a rectangular upper opening 220, which can also be designated as an aperture. At the lower side 212 of the reflector 210, the latter has a lower opening 230 in the form of a circular disk. The lower opening 230 can have a diameter of 1 mm, for example.

The optoelectronic semiconductor chip 150 is arranged in the lower opening 230 of the reflector 210. It is expedient if the optoelectronic semiconductor chip 150 is designed as a surface-emitting light-emitting diode chip. A radiation emission surface 151 of the optoelectronic semiconductor chip 150 is oriented perpendicular to the z direction 23, so that light emitted at the radiation emission surface 151 is emitted in the z direction 23 toward the optical element 310. It is expedient to orient the optoelectronic semiconductor chip 150 so that edges 155 of the radiation emission surface 151 are oriented parallel to edges 225 of the upper opening 220 of the reflector 210.

The mirror surface 240 of the reflector 210 is divided in the illustrated example into four azimuthal sectors 250, each of which adjoins one of the edges 225 of the upper opening 220. The mirror surface 240 has folds at boundaries 255 between the azimuthal sectors 250. The boundaries 255 extend between the lower opening 230 and the corners of the upper opening 220.

Each sector 250 of the mirror surface 240 is divided into an inner facet 260 and an outer facet 270. The inner facet 260 adjoins the lower opening 230. The outer facet 270 adjoins one of the edges 225 of the upper opening 220. The inner facet 260 and the outer facet 270 are each designed as planar and are arranged in relation to one another at an angle 275 recognizable in FIG. 2. The mirror surface 240 has a fold in each case at the boundary between the inner facet 260 and the outer facet 270.

However, the mirror surface 240 of the reflector 210 can also be designed differently, for example, as spherical or as a parabolic mirror.

The mirror surface 240 of the reflector 210 can backscatter light incident on the mirror surface 240, for example, with Lambertian characteristic. The mirror surface 240 can also have completely or partially specular reflection properties, however.

The spacers 280 are designed in the form of pins and are arranged in the area of the corners of the upper opening 220 on the upper side 211 of the reflector 210.

The reflectors 210 are integrally connected to one another in the reflector assembly 200 of the backlighting unit 1. The reflector assembly 200 can be produced, for example, by injection molding or by deep drawing.

Figure 4:
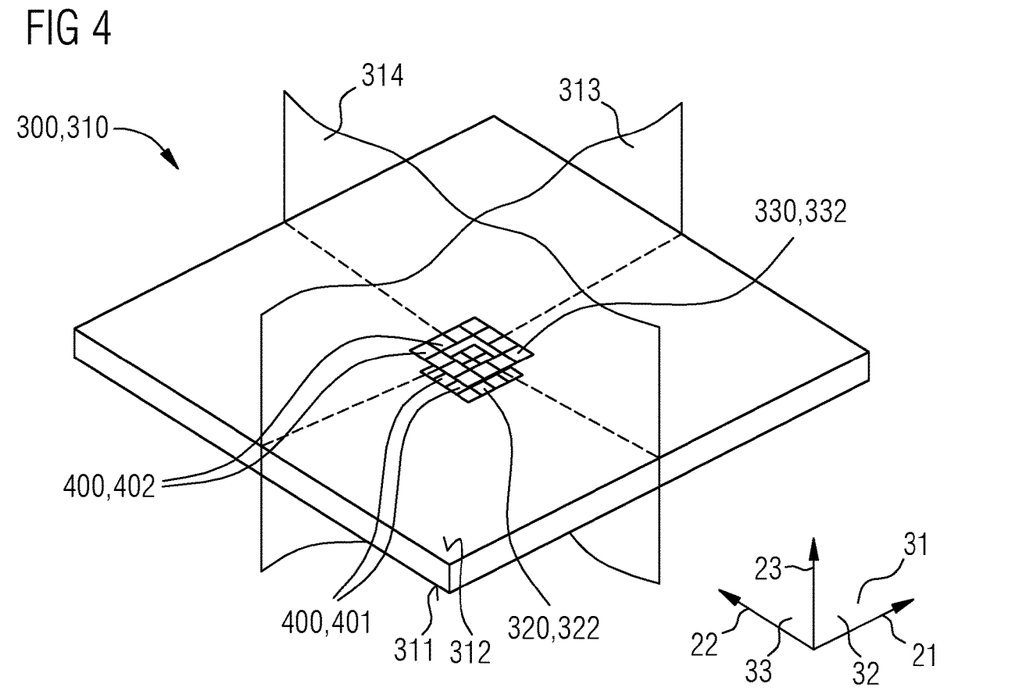
FIG. 4 shows a perspective illustration of an optical element of the cell of the backlighting unit.

FIG. 4 shows a schematic perspective illustration of the optical element 310 of the cell 10 of the backlighting unit 1 shown in FIG. 2 without the other components of the cell 10.

The front side 311 and the rear side 312 of the optical element 310 are each divided into a plurality of surface sections 400 arranged in the form of a matrix. The front side 311 is divided into front-side surface sections 400, 401 and the rear side 312 is divided into rear-side surface sections 400, 402. The surface sections 400 can also be designated as pixels.

It is expedient if the number of the front-side surface sections 400, 401 corresponds to the number of the rear-side surface sections 400, 402. In this case, each front-side surface section 400, 401 can be assigned a corresponding rear-side surface section 400, 402 and vice versa. The number of the front-side surface sections 400, 401 can also differ from the number of the rear-side surface sections 400, 402, however.

Figure 5:
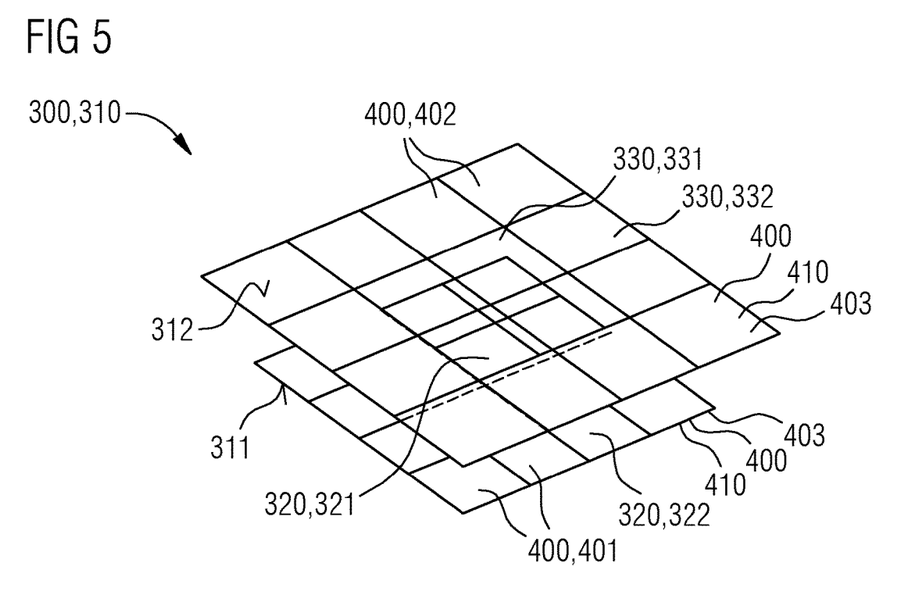
FIG. 5 shows a detail view of this optical element.

FIG. 5 shows a schematic illustration of a center area of the optical element 310. The front-side surface sections 400, 401 arranged in the form of a matrix may be distributed onto concentrically arranged front-side rectangular rings 320 starting from a center point of the front side 311 of the optical element 310. In FIG. 5, a central first front-side ring 321 and a second front-side ring 322 enclosing the first front-side ring 321 are shown by way of example. The first front-side ring 321 comprises four front-side surface sections 400, 401. The second front-side ring 322 comprises 12 front-side surface sections 400, 401. Rear-side rings 330 can accordingly also be assigned to the rear-side surface sections 400, 402, of which a first rear-side ring 331 and a second rear-side ring 332 enclosing the first rear-side ring 331 are shown by way of example in FIG. 5. In total, the front side 311 and the rear side 312 of the optical element 310 can each have, for example, 16 rings of surface sections 400, thus in each case 32×32 surface sections 400. For the sake of clarity, not all surface sections 400 of the front side 311 and the rear side 312 are shown in FIGS. 4 and 5.

Both the front side 311 and the rear side 312 of the optical element 310 cause forming of the light penetrating the optical element 310 of the cell 10 in operation of the backlighting unit 1. Each front-side surface section 400, 401 of the front side 311 and each rear-side surface section 400, 402 of the rear side 312 causes local beamforming here, which can be described by four parameters: each surface section 400 causes defined beam deflection in the x direction 21, a defined beam deflection in the y direction 22, a defined beam expansion in the x direction 21, and a defined beam expansion in the y direction 22.

The four parameters describing the optical functionality of the respective surface section 400 can differ here in different surface sections 400. For example, the front-side surface sections 400, 401 of the first front-side ring 320, 321 and the second front-side ring 320, 322 can be described by the following parameters:

| center x | center y | dimension x | dimension y | deflection x | deflection y | scattering width x | scattering width y |
|---|---|---|---|---|---|---|---|
| −0.125 | 0.125 | 0.249 | 0.249 | 5.000 | 5.000 | 5.000 | 5.000 |
| 0.125 | 0.125 | 0.249 | 0.249 | −5.000 | 5.000 | 5.000 | 5.000 |
| 0.125 | −0.125 | 0.249 | 0.249 | −5.000 | −5.000 | 5.000 | 5.000 |
| −0.125 | −0.125 | 0.249 | 0.249 | 5.000 | −5.000 | 5.000 | 5.000 |
| −0.375 | 0.375 | 0.249 | 0.249 | 19.711 | 19.711 | 1.908 | 1.908 |
| 0.375 | 0.375 | 0.249 | 0.249 | −19.711 | 19.711 | 1.908 | 1.908 |
| 0.375 | −0.375 | 0.249 | 0.249 | −19.711 | −19.711 | 1.908 | 1.908 |
| −0.375 | −0.375 | 0.249 | 0.249 | 19.711 | −19.711 | 1.908 | 1.908 |
| −0.125 | 0.375 | 0.249 | 0.249 | 15.808 | 34.677 | 19.982 | 1.369 |
| 0.125 | 0.375 | 0.249 | 0.249 | −15.808 | 34.677 | 19.982 | 1.369 |
| 0.125 | −0.375 | 0.249 | 0.249 | −15.808 | −34.677 | 19.982 | 1.369 |
| −0.125 | −0.375 | 0.249 | 0.249 | 15.808 | −34.677 | 19.982 | 1.369 |
| −0.375 | 0.125 | 0.249 | 0.249 | 34.677 | 15.808 | 1.369 | 19.982 |
| 0.375 | 0.125 | 0.249 | 0.249 | −34.677 | 15.808 | 1.369 | 19.982 |
| 0.375 | −0.125 | 0.249 | 0.249 | −34.677 | −15.808 | 1.369 | 19.982 |
| −0.375 | −0.125 | 0.249 | 0.249 | 34.677 | −15.808 | 1.369 | 19.982 |

The rear-side surface sections 400, 402 of the first rear-side ring 330, 331 and the second rear-side ring 330, 332 can be described, for example, by the following parameters:

| center x | center y | dimension x | dimension y | deflection x | deflection y | scattering width x | scattering width y |
|---|---|---|---|---|---|---|---|
| −0.151 | 0.151 | 0.301 | 0.301 | 5.000 | −5.000 | 5.000 | 5.000 |
| 0.151 | 0.151 | 0.301 | 0.301 | −5.000 | −5.000 | 5.000 | 5.000 |
| 0.151 | −0.151 | 0.301 | 0.301 | −5.000 | 5.000 | 5.000 | 5.000 |
| −0.151 | −0.151 | 0.301 | 0.301 | 5.000 | 5.000 | 5.000 | 5.000 |
| −0.466 | 0.466 | 0.327 | 0.327 | 15.258 | −15.258 | 3.105 | 3.105 |
| 0.466 | 0.466 | 0.327 | 0.327 | −15.258 | −15.258 | 3.105 | 3.105 |
| 0.466 | 0.466 | 0.327 | 0.327 | −15.258 | 15.258 | 3.105 | 3.105 |
| −0.466 | 0.466 | 0.327 | 0.327 | 15.258 | 15.258 | 3.105 | 3.105 |
| −0.151 | 0.466 | 0.301 | 0.327 | 15.242 | −20.120 | 18.090 | 0.797 |
| 0.151 | 0.466 | 0.301 | 0.327 | −15.242 | −20.120 | 18.090 | 0.797 |
| 0.151 | −0.466 | 0.301 | 0.327 | −15.242 | 20.120 | 18.090 | 0.797 |
| −0.151 | −0.466 | 0.301 | 0.327 | 15.242 | 20.120 | 18.090 | 0.797 |
| −0.466 | 0.151 | 0.327 | 0.301 | 20.120 | −15.242 | 0.797 | 18.090 |
| 0.466 | 0.151 | 0.327 | 0.301 | −20.120 | −15.242 | 0.797 | 18.090 |
| 0.466 | −0.151 | 0.327 | 0.301 | −20.120 | 15.242 | 0.797 | 18.090 |
| −0.466 | −0.151 | 0.327 | 0.301 | 20.120 | 15.242 | 0.797 | 18.090 |

The values "center x" and "center y" specify the position of the center point of the respective surface section 400 in the x direction 21 and in the y direction 22 in millimeters here. The values "dimension x" and "dimension y" specify the dimensions of the respective surface section 400 in the x direction 21 and in the y direction 22 in millimeters. The values "deflection x" and "deflection y" specify the beam deflection caused by the respective surface section 400 in the x direction 21 and in the y direction 22 in degrees. The values "scattering width x" and "scattering width y" specify the scattering width of the beam expansion caused by the respective surface section 400 in the x direction 21 and in the y direction 22 in degrees. The specified values each relate here to a beam incident along the z direction 23. The meaning of the parameters describing the optical functionality of the respective surface section 400 will be described in more detail hereinafter on the basis of FIGS. 6 and 7.

It can be seen from the exemplary values that the beam deflection caused by the surface sections 400 and the beam expansion caused by the surface sections 400 can differ in different surface sections 400. This is achieved in that at least some surface sections 400 are designed differently. Thus, not only do front-side surface sections 400, 401 differ from rear-side surface sections 400, 402, but also at least some front-side surface sections 400, 401 differ from one another and at least some rear-side surface sections 400, 402 differ from one another.

It can also be seen that at least different rear-side surface sections 400, 402 can have a different dimension in the x direction 21 and/or in the y direction 22. In the illustrated example, all front-side surface sections 400, 401 have the same dimension in the x direction 21 and in the y direction 22. However, it is also possible to design different front-side surface sections 400, 401 having different dimensions in the x direction 21 and/or in the y direction 22.

Because the dimension of individual rear-side surface sections 400, 402 in the x direction 21 and/or in the y direction 22 differs from the corresponding front-side surface sections 400, 401, the front-side surface sections 400, 401 are not congruent with the rear-side surface sections 400, 402. This means that not all front-side surface sections 400, 401 may be projected in the z direction 23 congruently onto the respective corresponding rear-side surface sections 400, 402. Light which has passed through a specific front-side surface section 400, 401 can thus also pass at least in large part through the rear-side surface section 400, 402 corresponding to the front-side surface section 400, 401 in spite of the beam deflection and beam expansion caused by the front-side surface section 400, 401.

It is expedient that the front side 311 of the optical element 310 and the rear side 312 of the optical element 310 are each mirror symmetrical with respect to the first plane of symmetry 313 parallel to the x-z plane 32 and are mirror symmetrical with respect to the second plane of symmetry 314 parallel to the y-z plane 33. However, it is also possible not to make the front side 311 and/or the rear side 312 mirror symmetrical with respect to the first plane of symmetry 313 and/or with respect to the second plane of symmetry 314.

Figure 6:
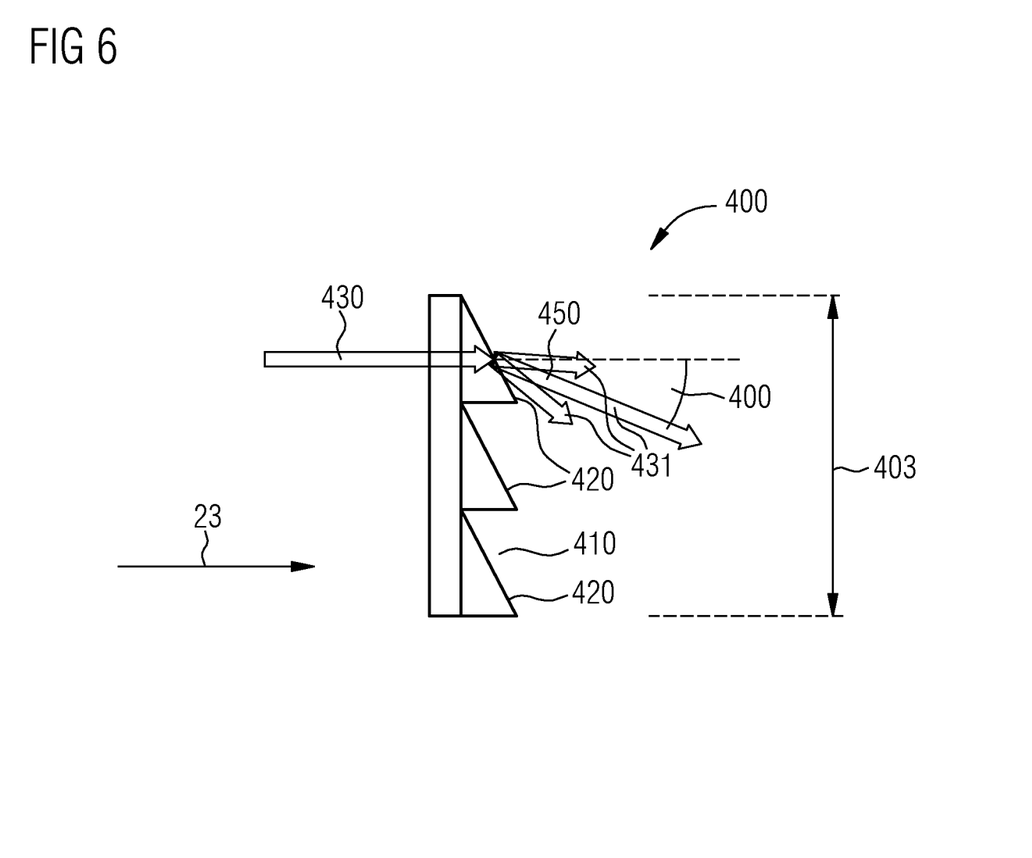
FIG. 6 shows a sectional side view of a surface section of the optical element.

FIG. 6 shows a schematic and simplified side view of a surface section 400 of the optical element 310 of the cell 10 of the backlighting unit 1 shown in FIG. 2. FIG. 6 shows a surface section 400, 401 of the front side 311 of the optical element 310. However, the following explanations also apply similarly to the rear-side surface sections 400, 402 of the optical element 310.

The surface section 400 has a dimension 403. The dimension 403 shown in the simplified two-dimensional illustration of FIG. 6 can be the dimension in the x direction 21 or in the y direction 22.

The surface section 400 has a surface 410 which causes the defined optical functionality of the surface section 400. For this purpose, the surface 410 is divided (faceted) into a plurality of surface parts 420. The surface parts 420 are each tilted in relation to the z direction 23. Due to the division of the surface 410 into the surface parts 420, the extension of the surface parts 420 in the z direction 23 is limited in spite of the tilt of the individual surface parts 420. A low overall thickness of the optical element 310 in the z direction 23 is thus enabled.

The defined beam deflection of the surface section 400 is caused by the tilting of the surface parts 420. In the two-dimensional illustration of FIG. 6, a beam deflection 440 is shown by way of example which can correspond to the defined beam deflection of the surface section 400 in the x direction 21 or the defined beam deflection of the surface section 400 in the y direction 22. The beam deflection 440 specifies by which angle the main emission direction of light 431 emitted from the surface section 400 differs from the z direction 23 if an incident light beam 430 is oriented parallel to the z direction 23.

The surface section 400 also causes, in addition to the defined beam deflection 440, a defined beam expansion 450. The beam expansion 450 schematically shown in FIG. 6 can be the beam expansion in the x direction 21 or in the y direction 22.

Figure 7:
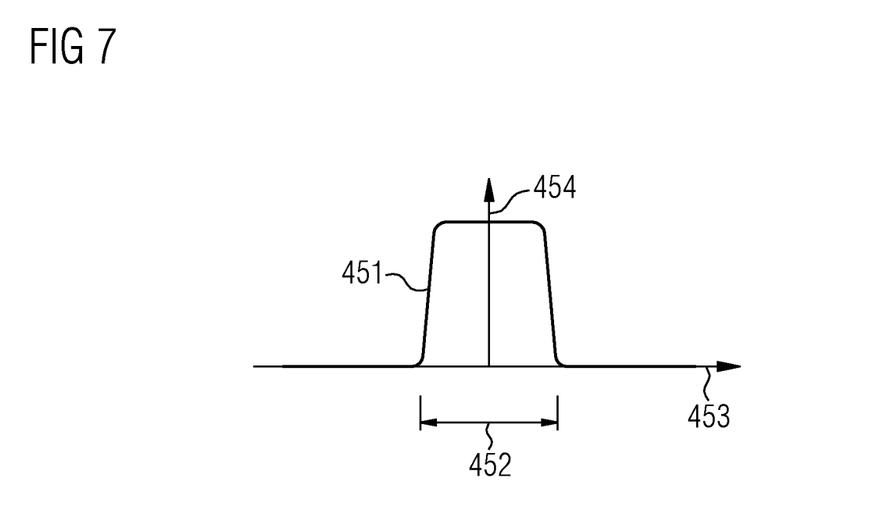
FIG. 7 shows a top hat scattering distribution.
Figure 8:
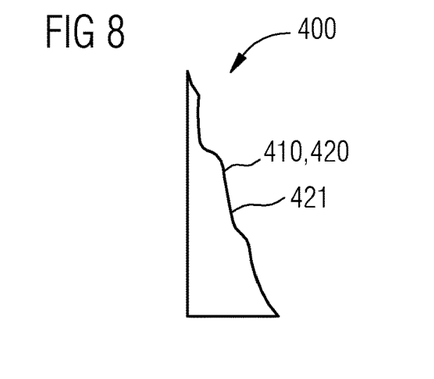
FIG. 8 shows a surface part of a surface section of the optical element according to one variant.
Figure 9:
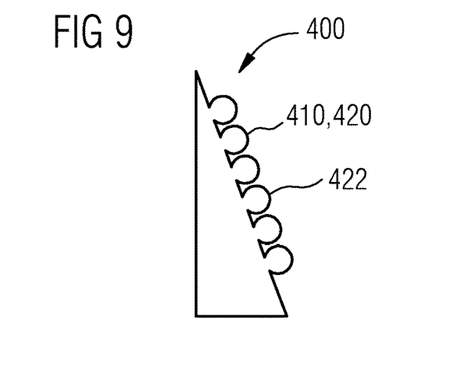
FIG. 9 shows a surface part of a surface section of the optical element according to a further variant.
Figure 10:
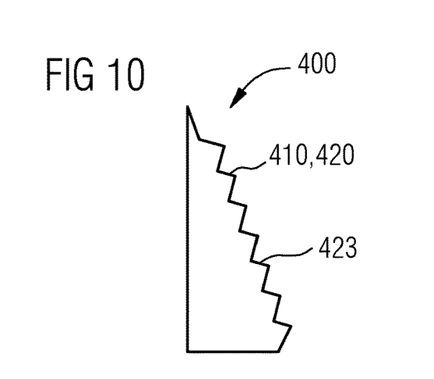
FIG. 10 shows a surface part of a surface section of the optical element according to a further variant.
Figure 11:
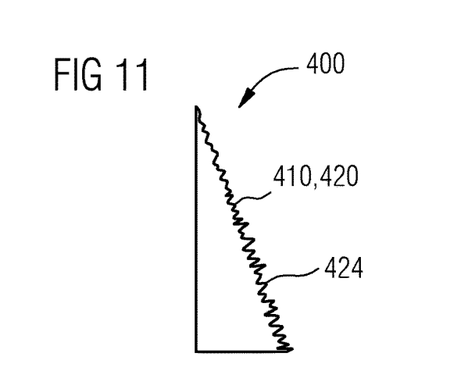
FIG. 11 shows a surface part of a surface section of the optical element according to a further variant.

The beam expansion 450 can take place, for example, according to a top hat scattering distribution 451 schematically shown in FIG. 7. In this case, the beam expansion 450 has a defined scattering width 452 dimensioned via a deflection angle 453. For deflection angles 453 within the defined scattering width 452, the deflected light has a substantially constant relative intensity 454. For deflection angles 453 outside the defined scattering width 452, the relative intensity 454 disappears. The beam expansion 450 caused by the surface section 400 can also take place according to a different scattering distribution, however.

The beam expansion 450 caused by the surface section 400 takes place refractively in that the surface parts 420 of the surface 410 each have a shape deviating from a planar surface. FIGS. 8, 9, 10, and 11 show exemplary possibilities of different shapes of a surface part 420 of the surface 410 of the surface section 400. In the example shown in FIG. 8, the surface part 420 has a continuous wave shape 421. In the example shown in FIG. 9, the surface part 420 has an arrangement of microlenses 422. In the example shown in FIG. 10, the surface part 420 has an arrangement of prisms 423. In the example shown in FIG. 11, the surface part 420 has a randomized roughening 424.

The boundaries between the individual surface parts 420 of the surface 410 of the surface section 400 can form a regular pattern or can be randomized.

The diffuser 500 of the backlighting unit 1 can be designed as a plane-parallel plate. In this case, the diffuser 500 comprises a base material and scattering particles 520 (FIG. 2) embedded in the base material. The base material can comprise PMMA, for example. The embedded scattering particles 520 can comprise $TiO_2$ or $Al_2O_3$, for example.

It is also possible to design the diffuser 500 of the backlighting unit 1 as a microoptically structured surface diffuser. In this case, the diffuser 500 can be designed as a film and can have structured surfaces, for example. The structuring can consist of a roughening or a random arrangement of prisms, for example.

Figure 12:
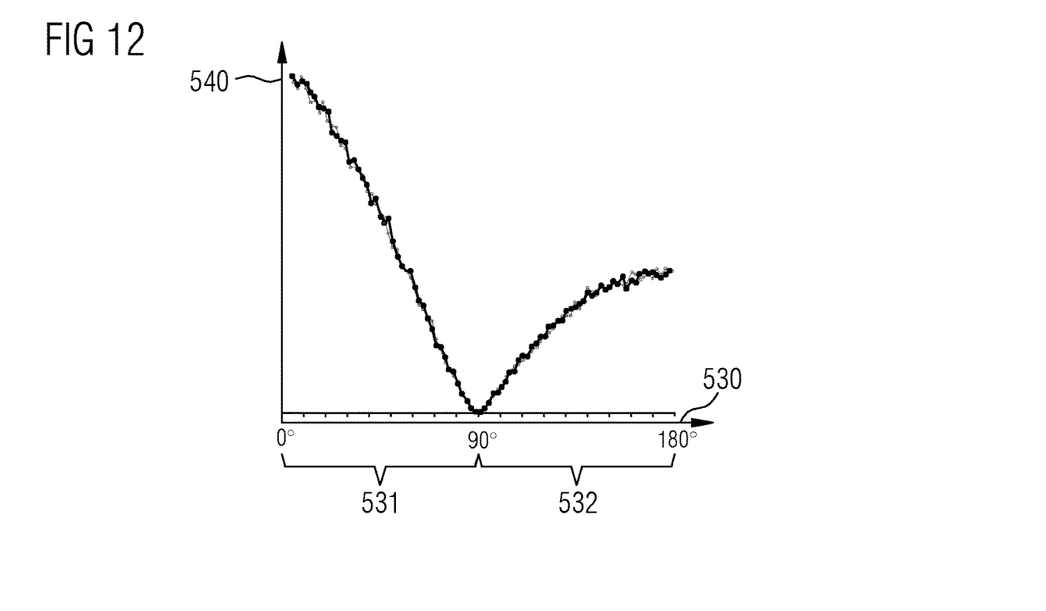
FIG. 12 shows a scattering characteristic of a diffuser of the backlighting unit.

FIG. 12 shows a diagram of an exemplary scattering characteristic of the diffuser 500. A scattering angle 530 is plotted on a horizontal axis. A relative intensity 540 of the scattered light is plotted on a vertical axis. In a first scattering angle range 531 from 0° to 90°, the relative intensity 540 decreases. In a second scattering angle range 532 from 90° to 180°, the relative intensity 540 increases. The relative intensity is greater here at a scattering angle 530 of 0° than at a scattering angle 530 of 180°. At a scattering angle 530 of 90°, the relative intensity 540 disappears. However, the diffuser 500 can also have a different scattering characteristic.

The invention was illustrated and described in more detail on the basis of the preferred exemplary embodiments. Nonetheless, the invention is not restricted to the disclosed examples. Rather, other variations can be derived therefrom by a person skilled in the art without leaving the scope of protection of the invention.

LIST OF REFERENCE NUMERALS 1 backlighting unit
10 cell
21 x direction
22 y direction
23 z direction
31 x-y plane
32 x-z plane
33 y-z plane
100 carrier
101 upper side
110 section
150 optoelectronic semiconductor chip
151 radiation emission surface
155 edge
200 reflector assembly
210 reflector
211 upper side
212 lower side
220 upper opening
225 edge
230 lower opening
240 mirror surface
250 azimuthal sector
255 boundary
260 inner facet
270 outer facet
275 angle
280 spacer
300 optical assembly
310 optical element
311 front side
312 rear side
313 first plane of symmetry
314 second plane of symmetry
320 front-side ring
321 first front-side ring
322 second front-side ring
330 rear-side ring
331 first rear-side ring
332 second rear-side ring
400 surface section
401 front-side surface section
402 rear-side surface section
403 dimension
410 surface
420 surface part
421 continuous wave shape
422 arrangement of microlenses
423 arrangement of prisms
424 randomized roughening
430 incident light beam
431 emitted light
440 beam deflection
450 beam expansion
451 top hat scattering distribution
452 scattering width
453 deflection angle
454 relative intensity
500 diffuser
510 section
511 front side
512 rear side
520 embedded scattering particles
530 scattering angle
531 first scattering angle range
532 second scattering angle range
540 relative intensity
550 spacer
600 holding frame
605 recess
610 first air gap
620 second air gap
630 wavelength-converting element

The invention claimed is:

1. A backlighting unit
having a carrier having an upper side arranged parallel to an x-y plane, a reflector assembly arranged above the carrier in a z direction, an optical assembly arranged above the reflector assembly in a z direction, and a diffuser arranged above the optical assembly in the z direction,
wherein a cell of the backlighting unit comprises a section of the carrier having an optoelectronic semiconductor chip arranged on the upper side, a reflector of the reflector assembly, an optical element of the optical assembly, and a section of the diffuser,
wherein the reflector has a concave mirror surface,
wherein the optical element has a front side facing toward the reflector and a rear side facing away from the reflector,
wherein the front side is divided into front-side surface sections arranged in the form of a matrix and the rear side is divided into rear-side surface sections arranged in the form of a matrix,
wherein at least two front-side surface sections are designed differently and at least two rear-side surface sections are designed differently,
wherein each front-side surface section and each rear-side surface section is designed so that a light beam penetrating the respective surface section centrally in the z direction experiences a defined beam deflection and a defined beam expansion,
wherein the front-side surface sections are not congruent with the rear-side surface sections, and
wherein the beam expansion takes place in at least one surface section according to a top hat scattering distribution having defined scattering width.

2. The backlighting unit as claimed in claim 1,
wherein an air gap is formed between the reflector assembly and the optical assembly.

3. The backlighting unit as claimed in claim 1,
wherein an air gap is formed between the optical assembly and the diffuser.

4. The backlighting unit as claimed in claim 1,
wherein the reflector has a rectangular upper opening on an upper side facing toward the optical element,
wherein edges of the optoelectronic semiconductor chip are oriented parallel to edges of the upper opening.

5. The backlighting unit as claimed in claim 1,
wherein the reflector has a lower opening in the form of a circular disk on a lower side facing toward the carrier,
wherein the optoelectronic semiconductor chip is arranged in the lower opening.

6. The backlighting unit as claimed in claim 1,
wherein the mirror surface of the reflector is divided into four azimuthal sectors,
wherein the mirror surface has folds at boundaries between the sectors.

7. The backlighting unit as claimed in claim 6,
wherein each sector has a planar inner facet and a planar outer facet,
wherein the inner facet and the outer facet are arranged at an angle in relation to one another.

8. The backlighting unit as claimed in claim 1,
wherein the defined beam deflection differs in at least two surface sections and/or the defined beam expansion differs in at least two surface sections.

9. The backlighting unit as claimed in claim 1,
wherein at least two front-side surface sections have different dimensions and/or at least two rear-side surface sections have different dimensions.

10. The backlighting unit as claimed in claim 1,
wherein the number of the front-side surface sections corresponds to the number of the rear-side surface sections.

11. The backlighting unit as claimed in claim 1,
wherein the front side of the optical element and/or the rear side of the optical element are mirror symmetrical with respect to a plane of symmetry parallel to an x-z plane and are mirror symmetrical with respect to a plane of symmetry parallel to a y-z plane.

12. The backlighting unit as claimed in claim 1,
wherein a surface of at least one surface section is divided into a plurality of surface parts,
wherein the surface parts are each tilted in relation to the z direction.

13. The backlighting unit as claimed in claim 12,
wherein the surface parts each have a shape deviating from a planar surface, in particular a wave shape, an arrangement of microlenses, an arrangement of prisms, or a randomized roughening.

14. The backlighting unit as claimed in claim 1,
wherein the diffuser is designed as a plane-parallel plate,
wherein the diffuser has embedded scattering particles.

15. The backlighting unit as claimed in claim 1,
wherein the diffuser is designed as a microoptically structured surface diffuser.

16. The backlighting unit as claimed in claim 1,
wherein the diffuser scatters light upon irradiation using a collimated light source so that the relative intensity decreases in a first scattering angle range from 0° to 90° and increases in a second scattering angle range from 90° to 180°, wherein the relative intensity is greater at a scattering angle of 0° than at a scattering angle of 180°.

17. The backlighting unit as claimed in claim 1,
wherein a wavelength-converting element is arranged between the optical assembly and the diffuser.

18. The backlighting unit as claimed in claim 1,
wherein the backlighting unit has multiple identical cells,
wherein the cells are arranged in the form of a matrix.

19. A backlighting unit
having a carrier having an upper side arranged parallel to an x-y plane, a reflector assembly arranged above the carrier in a z direction, an optical assembly arranged above the reflector assembly in a z direction, and a diffuser arranged above the optical assembly in the z direction,
wherein a cell of the backlighting unit comprises a section of the carrier having an optoelectronic semiconductor chip arranged on the upper side, a reflector of the reflector assembly, an optical element of the optical assembly, and a section of the diffuser,
wherein the reflector has a concave mirror surface,
wherein the optical element has a front side facing toward the reflector and a rear side facing away from the reflector,
wherein the front side is divided into front-side surface sections arranged in the form of a matrix and the rear side is divided into rear-side surface sections arranged in the form of a matrix,
wherein at least two front-side surface sections are designed differently and at least two rear-side surface sections are designed differently,
wherein each front-side surface section and each rear-side surface section is designed so that a light beam penetrating the respective surface section centrally in the z direction experiences a defined beam deflection and a defined beam expansion,
wherein the front-side surface sections are not congruent with the rear-side surface sections,
wherein the beam expansion takes place in at least one surface section according to a top hat scattering distribution having defined scattering width, and
wherein an air gap is formed between the optical assembly and the diffuser.

* * * * *